(12) United States Patent

Forrest et al.

(10) Patent No.: US 7,970,990 B2
(45) Date of Patent: Jun. 28, 2011

(54) MEMORY MODULE WITH OPTICAL INTERCONNECT THAT ENABLES SCALABLE HIGH-BANDWIDTH MEMORY ACCESS

(75) Inventors: Craig S. Forrest, San Francisco, CA (US); Ashok V. Krishnamoorthy, San Diego, CA (US)

(73) Assignee: Oracle America, Inc., Redwood Shores, CA (US)

( * ) Notice: Subject to any disclaimer, the term of this patent is extended or adjusted under 35 U.S.C. 154(b) by 352 days.

(21) Appl. No.: 11/526,219

(22) Filed: Sep. 22, 2006

(65) Prior Publication Data

US 2008/0077731 A1    Mar. 27, 2008

(51) Int. Cl.
*G06F 12/00* (2006.01)
(52) U.S. Cl. .......... 711/114; 711/104; 711/E12.007
(58) Field of Classification Search .......... 711/104
See application file for complete search history.

(56) References Cited

U.S. PATENT DOCUMENTS

| | | | | |
|---|---|---|---|---|
| 6,580,538 B1 * | 6/2003 | Kartalopoulos | ........... | 398/79 |
| 6,625,687 B1 * | 9/2003 | Halbert et al. | ........... | 711/105 |
| 6,651,139 B1 * | 11/2003 | Ozeki et al. | ........... | 711/118 |
| 6,731,875 B1 * | 5/2004 | Kartalopoulos | ........... | 398/68 |
| 6,778,596 B1 * | 8/2004 | Tzannes | ........... | 375/222 |
| 2002/0038405 A1 * | 3/2002 | Leddige et al. | ........... | 711/115 |
| 2003/0043426 A1 * | 3/2003 | Baker et al. | ........... | 359/109 |
| 2004/0126115 A1 * | 7/2004 | Levy et al. | ........... | 398/116 |
| 2005/0044304 A1 * | 2/2005 | James | ........... | 711/105 |
| 2005/0147414 A1 * | 7/2005 | Morrow et al. | ........... | 398/142 |
| 2006/0020740 A1 * | 1/2006 | Bartley et al. | ........... | 711/100 |
| 2008/0040562 A1 * | 2/2008 | Gower et al. | ........... | 711/154 |

* cited by examiner

*Primary Examiner* — Reginald G Bragdon
*Assistant Examiner* — Aracelis Ruiz
(74) *Attorney, Agent, or Firm* — Park, Vaughan, Fleming & Dowler LLP; Mark Spiller

(57) ABSTRACT

One embodiment of the present invention provides a system that facilitates scalable high-bandwidth memory access using a memory module with optical interconnect. This system includes an optical channel, a memory buffer, and a random-access memory module. The memory buffer is configured to receive a request from a memory controller via the optical channel. The memory buffer handles the received request by performing operations on the random-access memory module and then sending a response to the memory controller via the optical channel. Hence, the memory module with optical interconnect provides a high-speed serial link to the random-access memory module without consuming a large number of pins per channel on the memory controller.

21 Claims, 4 Drawing Sheets

MEMORY MODULE WITH OPTICAL INTERCONNECT THAT ENABLES SCALABLE HIGH-BANDWIDTH MEMORY ACCESS

BACKGROUND

1. Field of the Invention

The present invention generally relates to semiconductor memory modules. More specifically, the present invention relates to structures and methods associated with an memory module with optical interconnect that enables scalable high-bandwidth memory access.

2. Related Art

A widely-accepted tenet of Moore's Law states that the number of transistors that fit in a square inch of integrated circuitry approximately doubles every two years. For over three decades, technological advances have kept pace with Moore's Law and in doing so have helped to drive processor performance to new heights. Processor manufacturers have exploited the additional circuitry made possible by these advances to build complex processors that support increasing clock frequencies and instruction-level parallelism. Today, such processors accelerate a single instruction pipeline by employing multi-gigahertz frequencies and a variety of sophisticated mechanisms and techniques, such as large caches, superscalar designs, out-of-order execution, deep pipelines, and speculative pre-fetching.

While processor speeds have doubled every two years, memory speeds have only doubled every six years. This growing disparity results from memory suppliers focusing on design objectives based on density and cost rather than on speed. The growing disparity between processor and memory access speeds is presently causing memory latency to dominate application performance. Processors are frequently left idle while waiting for memory accesses to return data, which largely mitigates the performance improvements made possible by increasing processor clock rates. Some processors are configured to access multiple banks of interleaved memories in parallel to increase memory bandwidth. However, because each parallel memory channel consumes a large number of pins, simply increasing the number of channels supported by a memory controller can significantly increase system cost.

Fully-buffered memory technology can replace such multi-pin parallel memory channels with high-speed point-to-point serial interfaces, but such techniques are limited to short distances, and the number of connections is still proportional to the number of desired memory channels.

Hence, what is needed are structures and methods that enable scalable high-bandwidth memory access without the above-described problems.

SUMMARY

One embodiment of the present invention provides a system that facilitates scalable high-bandwidth memory access using a memory module with optical interconnect. This system includes an optical channel, a memory buffer, and a random-access memory module. The memory buffer is configured to receive a request from a memory controller via the optical channel. The memory buffer handles the received request by performing operations on the random-access memory module and then sending a response to the memory controller via the optical channel. Hence, the memory module with optical interconnect provides a high-speed serial link to the random-access memory module without consuming a large number of pins per channel on the memory controller.

In a variation on this embodiment, using an optical channel allows the distance between the memory module and the memory controller to be increased in comparison to other electrical approaches.

In a variation on this embodiment, the memory buffer includes pass-through and merging logic that allows the optical channel to be shared between multiple memory modules with optical interconnect that are coupled in series.

In a further variation, the memory module is configured to use wavelength-division-multiplexing to increase bandwidth and throughput without increasing the number of optical fibers needed. The use of multiple fibers and/or wavelength-division multiplexing allows multiple memory modules with optical interconnect to share the optical channel to provide high-bandwidth memory access.

In a further variation, the optical channel includes a first optical channel that carries requests from the memory controller to the memory buffer, and a second optical channel that carries responses from the memory buffer to the memory controller. In this embodiment, the first optical channel and the second optical channel are separate high-speed, unidirectional optical channels.

In a further variation, the first optical channel comprises one or more optical fibers, and the bandwidths of the first optical channel and second optical channel are asymmetric.

In a variation on this embodiment, the memory controller includes a discovery mechanism that detects the memory modules present on the optical channel. In a further variation, this discovery mechanism can include a broadcast mechanism.

In a variation on this embodiment, the number of memory modules sharing the optical channel scales based on system memory needs.

In a variation on this embodiment, the random-access memory module is a fully-buffered dual inline memory module with dynamic random-access memory.

DETAILED DESCRIPTION

The following description is presented to enable any person skilled in the art to make and use the invention, and is provided in the context of a particular application and its requirements. Various modifications to the disclosed embodiments will be readily apparent to those skilled in the art, and the general principles defined herein may be applied to other embodiments and applications without departing from the spirit and scope of the present invention. Thus, the present invention is not limited to the embodiments shown, but is to be accorded the widest scope consistent with the claims.

Memory Latency

Figure 1:
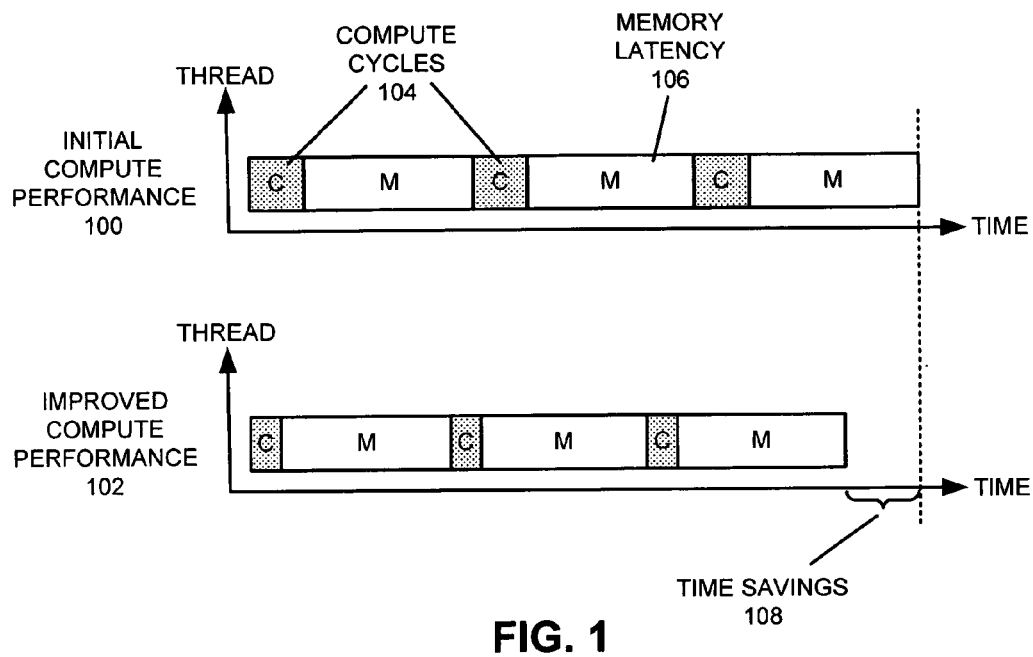
FIG. 1 illustrates the difficulty of improving system performance by only increasing processor performance without increasing memory access speeds in accordance with an embodiment of the present invention.

FIG. 1 illustrates the difficulty of improving system performance purely by improving processor performance without improving memory access speed. The top graph in FIG. 1 shows the initial compute performance 100 of the system based on compute cycles 104 and the memory latency 106 between compute cycles. Dramatically improving the speed of the processor may result in improved compute performance 102, but results in a relatively small overall time savings 108. For instance, doubling the speed of the processor may decrease the compute time by half, but only improves the total application running time by a small percentage because of memory latency effects which limit single-thread performance. Many data-center workloads are simply unable to take advantage of hard-won advances in processors because of such memory latency problems.

Figure 2:
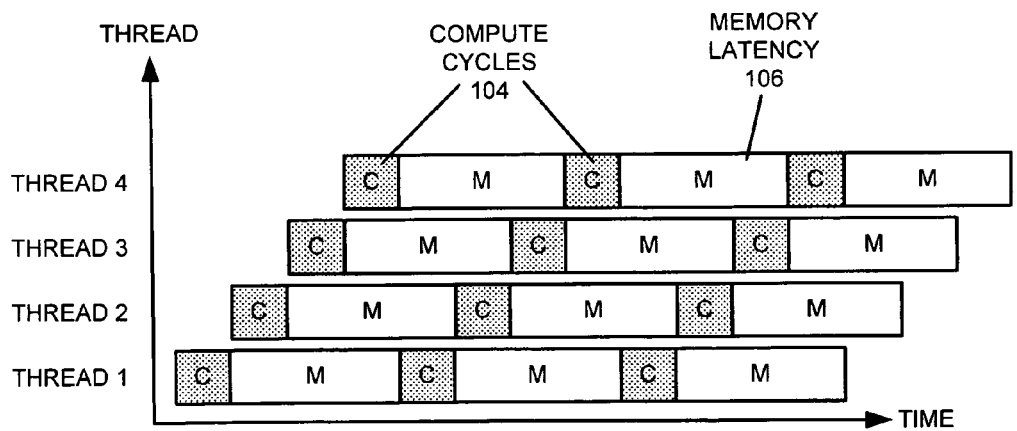
FIG. 2 illustrates "throughput computing" in accordance with an embodiment of the present invention.

FIG. 2 illustrates "throughput computing," a technique that mitigates the negative effects of memory latency. Launching multiple threads in parallel hides memory latency and uses processor cycles more efficiently, thereby improving overall application performance.

Multi-threading provides an effective way to combat memory latency, but demands memory modules with higher communication bandwidth. While the capacity of dual inline memory modules (DIMMs) has increased due to improved dynamic random access memory (DRAM) density, the total bandwidth per channel has typically stayed flat. Adding additional parallel channel interfaces could increase the effective memory bandwidth, but may require a large number of pins per channel and thereby exceed the number of pins available in a given semiconductor package. Because of such difficulties in cost-effectively increasing memory sub-system bandwidth to match processor improvements, the memory subsystem typically becomes the limiting system resource.

Fully-Buffered Memory

Fully-buffered memory (also referred to as FB-DIMM) can be used to increase memory capacity and to keep pace with both processor and input/output (I/O) improvements by replacing parallel memory channels with a high-speed serial interface. FB-DIMM technology splits the signaling interface between the memory controller and DRAM chips into two independent signaling interfaces with a buffer between them. The interface between the buffer and DRAM chips remains substantially similar to existing DRAM interfaces, for instance supporting existing memory interface standards such as double data rate DDR2 and DDR3. However, the interface between the memory controller and the buffer is changed from a shared parallel interface to a point-to-point serial interface, with the buffer (also referred to as an advanced memory buffer (AMB)) operating in response to memory controller commands. Upon receiving a command containing a DRAM request over the FB-DIMM interface, the AMB presents a DRAM request to the DRAM chips.

FB-DIMM modules improve scalability and throughput. For instance, one embodiment of FB-DIMM technology offers a capacity of up to 192 gigabytes and 6.7 gigabytes per second sustained data throughput per channel when using six channels with eight DIMMS per channel, two ranks per DIMM, and 1 gigabyte DRAMs.

FB-DIMM interfaces typically use serial-differential signaling, and can support backward compatibility of memory devices, but carry signals over electrical wiring. The power consumed by clock and data recovery (CDR) circuits in electrical FB-DIMMs increases with the distance traversed, which limits the maximum distance between the FB-DIMM and the memory controller. Electrical FB-DIMMs typically also have significant bit lane to bit lane skew, which requires de-skewing that tends to increase the per-DIMM access latency. For instance, the system multiplexing together the individual bit lanes (for the DRAM) for serial transmission, transporting them to the FB-DIMM, and then de-multiplexing the transmission back into individual bit lanes can result in skew during the clock and data recovery of the individual bit lanes.

Note that each FB-DIMM channel also uses a separate serial connection. While increasing the number of channels uses less area than the number of pins used in previous designs, the number of connections still scales in proportion to the number of desired channels.

One embodiment of the present invention provides a memory module with optical interconnect that provides scalable high-speed memory access and overcomes the distance limitations of high-speed electrical signaling. This embodiment uses optical FB-DIMMs with on-module electrical-to-optical transceivers to achieve high aggregate transmission capacity and low latency for memory accesses. Optics help to reduce the power consumption and can reduce, if not eliminate, the distance dependence of electrical FB-DIMMs. Optics, particularly wave-division-multiplexed optics, also can help to reduce or eliminate bit line skew, and can be used to increase the number of DIMMs per FB-DIMM channel.

Optically Connected Fully-Buffered Memory

Optical transmission techniques play an important role in supporting long distance communication for global, interstate, metro, campus, and even intra-building or central-office applications. However, the question of whether optical transmission techniques can be used within individual computer systems depends on improvements in bandwidth-density and the I/O bandwidth achievable per unit area or volume.

Electrical VLSI circuits are expected to be used to process information in the foreseeable future. Because any optical-interconnect system involves optical-to-electrical and electrical-to-optical conversion, using optical components to break electrical bottlenecks involves tightly-integrated photonics and electronics to efficiently deliver data to the desired electrical components. As mentioned previously, an important electrical bottleneck occurs between the DIMMs and the memory controller chip.

One embodiment of the present invention involves using an FB-DIMM-based memory subsystem that provides optical links to overcome the distance, connection, and throughput limitations of high-speed serial electrical links. Such optically-enabled FB-DIMMs achieve very high I/O bandwidth per unit area, and allow capacity and bandwidth scaling, thereby enabling memory to keep pace with processor and I/O improvements. Furthermore, such modules also extend the reach of FB-DIMM technology by allowing a less-constrained physical architecture to be deployed.

Figure 3A:
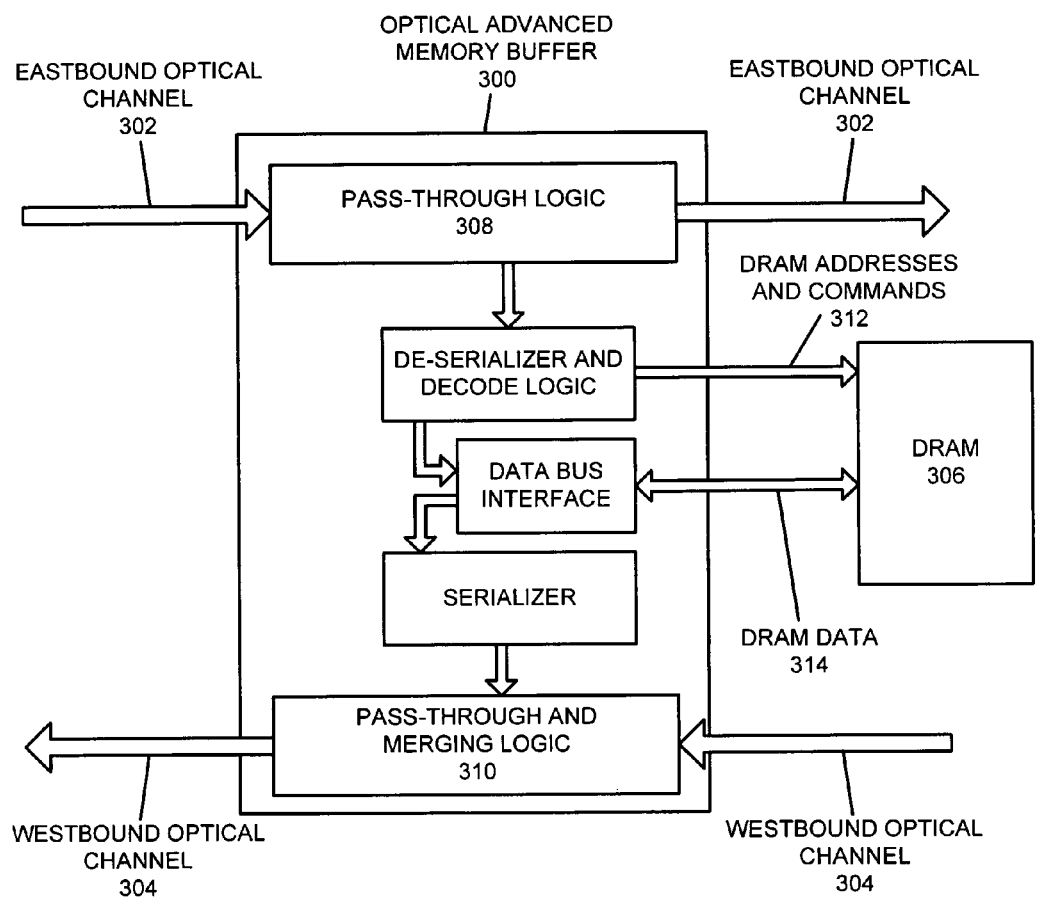
FIG. 3A illustrates a memory module with optical interconnect in accordance with an embodiment of the present invention.

FIG. 3A illustrates an optical FB-DIMM that includes an optical advanced memory buffer (OAMB) 300, a DRAM 306, and several optical channels. In one embodiment of the present invention, the optical FB-DIMM uses high-speed, unidirectional point-to-point optical signals for the memory channels. Traffic on the eastbound optical channel 302 travels from the memory controller to the optical FB-DIMM, and includes commands and data to be written to the memory of the optical FB-DIMM. Traffic on the westbound optical channel 304 includes data read from the DRAM 306 and other responses to the memory controller. In one embodiment of the present invention, traffic on the optical channels travels at six times the speed of data on a non-optical FB-DIMM.

OAMB 300 presents the FB-DIMM memory requests to the local DRAM 306. OAMB 300 also provides intelligent eastbound and westbound channel initialization to align high-speed serial clocks, locate frame boundaries, and verify channel connectivity.

Figure 4:
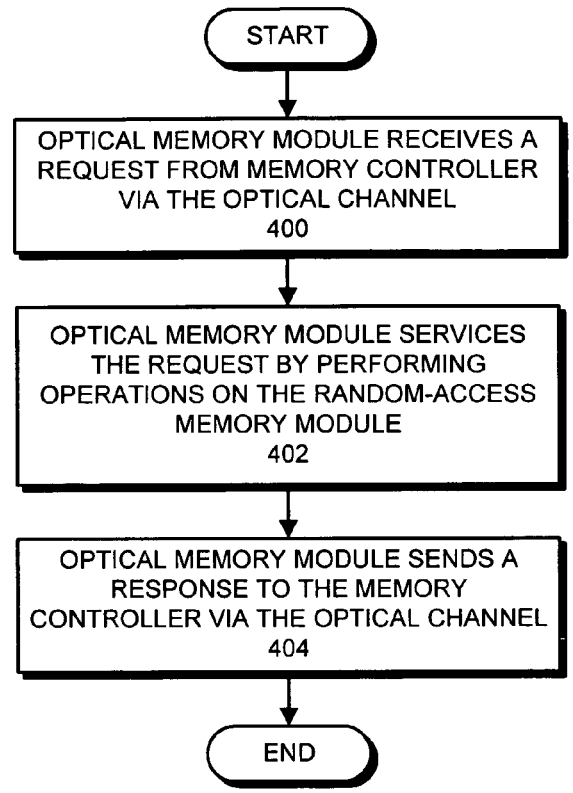
FIG. 4 is a flow chart illustrating the process of handling a memory request to a memory module with optical interconnect in accordance with an embodiment of the present invention.

FIG. 4 is a flow chart illustrating the process of handling a memory request to a memory module with optical interconnect. First, the memory module receives a request from a memory controller via the optical channel (step 400). The memory module services this request by performing operations on the random-access memory module (step 402). The memory module then returns the output of these operations to the memory controller by sending a response to the memory controller via the optical channel (step 404).

In one embodiment of the present invention, OAMB 300 includes pass-through logic 308 on the eastbound optical channel and pass-through and merging logic 310 on the westbound optical channel 304. This logic allows OAMB 300 to, for instance, selectively de-serialize and decode optical signals, or allow such signals to pass through to other optical FB-DIMMs coupled in series. In this embodiment, when the memory controller sends a frame on the eastbound optical channel 302 to the optical FB-DIMMs, the first optical FB-DIMM's OAMB 300 checks whether the requests applies to the local DRAM. If not, the frame is passed-through or repeated to the next eastbound optical FB-DIMM. OAMB 300 similarly repeats or passes-through westbound frames to the memory controller or an adjacent westbound optical FB-DIMM.

OAMB 300 also provides control and interface signals for the DRAM(s) 306 on the given FB-DIMM. Hence, OAMB 300 converts eastbound write data destined for its module to standard DRAM signals comprised of DRAM addresses and commands 312. In doing so, OAMB 300 serializes data read from the DRAM 314 in response to a request and then sends the data to the memory controller via the westbound optical channel 304. Note that the optical FB-DIMM buffers the DRAM signals from the memory controller within the OAMB 300. Note also that in one embodiment, the optical channels carry separate eastbound and westbound uni-directional signals, thereby allowing simultaneous data reads and writes.

Note that an arrangement using such optical channels may result in non-uniform memory latency if a number of memory modules serially utilize the optical channels, because the last memory module in the chain will experience longer latencies on both the eastbound and westbound optical channels. Such non-uniformity could become appreciable if the length of the optical channels is increased.

Figure 3B:
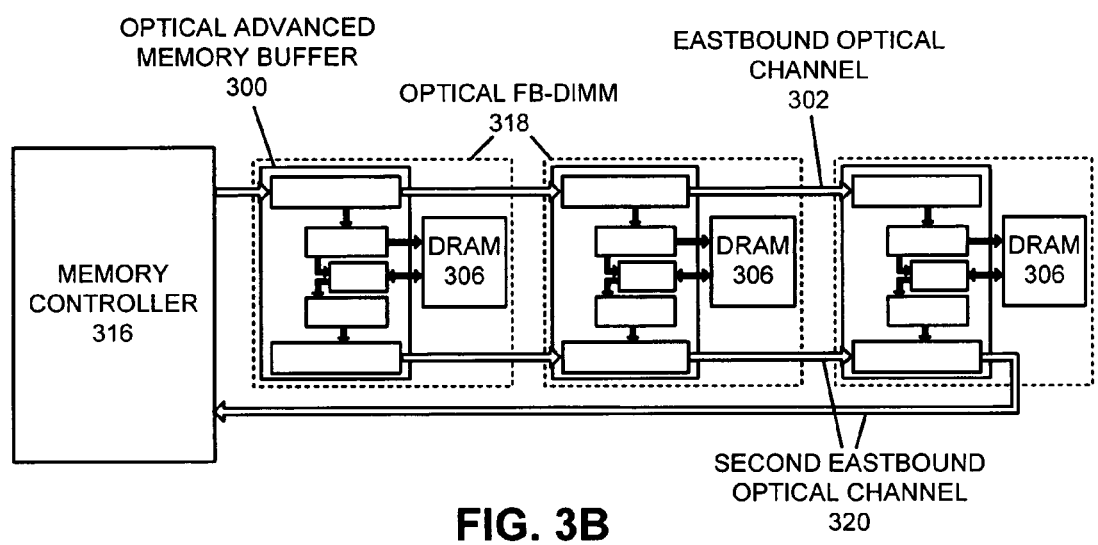
FIG. 3B illustrates a memory controller that accesses a set of memory modules with optical interconnect in accordance with an embodiment of the present invention.

FIG. 3B illustrates an embodiment of the present invention in which traffic is directed eastbound for both of the optical channels. In FIG. 3B, a memory controller 316 sends requests to three optical FB-DIMMs 318. In this embodiment, the system uses a second eastbound optical channel 320 instead of a westbound channel. Connecting the memory controller to the first and second optical channels at opposite ends of the chain of memory modules reduces the optical latency disparity, because the memory modules closer to the memory controller on the first optical channel are farther away on the second channel, and vice-versa.

Using optical signals between the memory controller and the optical FB-DIMM allow the architecture to be extended across longer distances and more memory modules than previous approaches. Sophisticated protocols may be used to discover and communicate between the memory controller, multiple memory modules, and other potential participants. For longer distances, an OAMB can be designed to act as a simple buffered repeater. Optionally, flow-control can be added to signal lanes within the optical channels. Such lanes can be implemented via optical signals traveling on optical fiber. Note also that the eastbound and westbound optical channels may include a different number of signal lanes and/or optical fibers.

Figure 5:
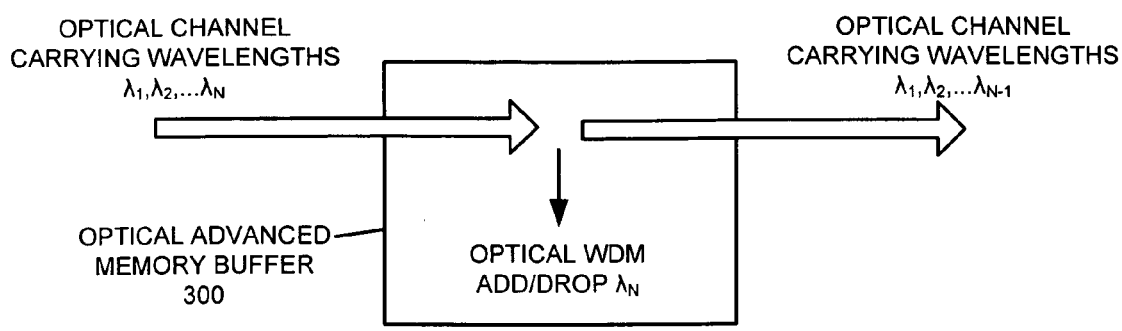
FIG. 5 illustrates a memory module with optical interconnect that separates and handles one wavelength from an optical channel supporting wavelength-division-multiplexing in accordance with an embodiment of the present invention.

In one embodiment of the present invention, optical signal lanes may be implemented as different wavelengths on the same optical fiber via wavelength-division multiplexing (WDM). Note that in this embodiment, not every wavelength needs to be converted. For instance, each OAMB may be assigned to monitor and respond to signals on one wavelength and pass-through all other wavelengths on an optical fiber, as shown in FIG. 5, in which the OAMB 300 illustrated separates and then receives data from or adds data to only wavelength $\lambda_N$. Alternatively, the system can also use multiple optical fibers to provide additional bandwidth. In an embodiment involving multiple fibers, each OAMB may be assigned to monitor and respond to signals on only one fiber, and pass-through signals on all other optical fibers.

In one embodiment of the present invention, a system including a FB-DIMM with optical interconnect can use WDM to place all of the individual bit-lane channels into a fiber without needing to temporally multiplex the channels. Alternatively, the system may choose to use temporal multiplexing, or a mixture of the two techniques. Using WDM allows the system to eliminate the need for de-skewing as well as potentially eliminate or reduce the need for clock and data recovery.

By intimately integrating an optical interface with an FB-DIMM module to create an optical FB-DIMM module, the present invention:
  Provides seamless, scalable electrical-to-optical communication capacity over extended distances;
  Reduces power dissipation by using low-power optical links;
  Allows channel count and capacity to increase scalably without increasing the number of optical fibers when using wavelength-division multiplexing;
  Avoids fundamental bottlenecks for high channel data rates (e.g. above 20 GHz);
  Supports the ability to find and communicate with optical FB-DIMMs by using an optical broadcast and discovery capability;
  Reduces electromagnetic interference by reducing off-chip electrical bandwidth; and
  Reduces module weight.

In addition, the optical FB-DIMM concept retains many of the useful benefits of FB-DIMM technology, including: the compatibility of FB-DIMMs across several DIMM generations; the ability to field-swap DIMMs; the ability to repurpose a system for compute-intensive, data-intensive, or I/O intensive applications; and high-reliability memory interfaces that include cyclical-redundancy-check protection on address lines.

In summary, the present invention provides a memory module with optical interconnect that provides scalable high-speed memory access. By tightly-integrating an optical interface with a FB-DIMM module, the present invention increases memory bandwidth, reduces memory latency, and overcomes the distance limitations of electrical signaling.

The foregoing descriptions of embodiments of the present invention have been presented only for purposes of illustration and description. They are not intended to be exhaustive or to limit the present invention to the forms disclosed. Accordingly, many modifications and variations will be apparent to practitioners skilled in the art. Additionally, the above disclosure is not intended to limit the present invention. The scope of the present invention is defined by the appended claims.

What is claimed is:

1. A memory system, comprising:
   a memory controller;
   a first memory module and a second memory module, where each memory module comprises a memory buffer and a random-access memory device; and
   an optical channel that supports wavelength-division multiplexing;
   wherein the memory controller is coupled in series first to the first memory module and to the second memory module using the optical channel;
   wherein the memory buffer in a memory module is configured to receive a request from the memory controller via the optical channel, handle the request by accessing the random-access memory device, and send a response to the memory controller via the optical channel;
   wherein the first memory module is configured to monitor for and respond to requests in the optical channel that are encoded in a first wavelength and the second memory module is configured to monitor for and respond to requests in the optical channel that are encoded in a second wavelength; and
   wherein the first memory module removes the first wavelength from the optical channel while passing the second wavelength through without delay and without electrical conversion, thereby reducing request latency for requests not intended for the first memory module.

2. The memory system of claim 1, wherein a buffered repeater mechanism in the first memory module facilitates extending the distance between the memory controller and the second memory module beyond a distance normally associated with the optical channel.

3. The memory system of claim 1, wherein the memory buffer includes pass-through and merging logic that allows the optical channels to be shared between multiple memory modules that are coupled in series.

4. The memory system of claim 3, wherein using wavelength-division multiplexing increases the capacity of the optical channels without increasing the number of optical fibers needed for communication between the memory modules and the memory controller.

5. The memory system of claim 4,
   wherein the one or more optical channels include an incoming optical channel and an outgoing optical channel;
   wherein the first memory module and the second memory are arranged serially to share the incoming optical channel and the outgoing optical channel;
   wherein the incoming optical channel carries requests from the memory controller to the first memory module and then to the second memory module;
   wherein the outgoing optical channel carries responses from the first memory module to the second memory module and then to the memory controller; and
   wherein connecting the memory controller to the incoming optical channel and the outgoing optical channel at opposite ends of the chain of memory modules reduces the optical latency disparity for the memory modules.

6. The memory system of claim 5, wherein the incoming optical channel and the outgoing optical channel are separate high-speed, uni-directional optical channels.

7. The memory system of claim 6,
   wherein the incoming optical channel comprises one or more optical fibers;
   wherein the outgoing optical channel comprises one or more optical fibers;
   wherein the traffic bandwidth needed for the incoming optical channel is predicted to be different from the traffic bandwidth needed for the outgoing optical channel; and
   wherein the bandwidth of the incoming optical channel and the bandwidth of the outgoing optical channel are asymmetric to ensure that the optical channel with more traffic does not become a bottleneck.

8. The memory system of claim 3, wherein the memory controller includes a discovery mechanism that detects the memory modules present on the optical channels.

9. The memory system of claim 8, wherein the discovery mechanism includes a broadcast mechanism.

10. The memory system of claim 3, wherein the memory module is configured to allow the number of memory modules sharing the optical channels to be changed based on system memory needs.

11. The memory system of claim 1, wherein the random-access memory device is a fully-buffered dual inline memory module with dynamic random-access memory.

12. The memory system of claim 1,
   wherein a multi-bit value is transmitted over the optical channel in parallel using wavelength-division multiplexing, where each bit of the multi-bit value is transmitted using a separate wavelength; and
   wherein transmitting the bits of the multi-bit value in parallel using wavelength-division multiplexing facilitates reducing the clock rate of the transmitting and receiving circuits in the memory controller and the memory modules while also reducing the transmit and receive latencies for the request and the response.

13. A method for handling a memory request to a memory module with optical interconnect, comprising:
   receiving a request transmitted using a wavelength from a memory controller via an optical channel that supports wavelength-division multiplexing;
   determining that the wavelength is to be processed in the memory module; and
   removing the wavelength from the optical channel;
   wherein the memory module is included in a memory system with additional optically interconnected memory modules;
   wherein each memory module comprises a memory buffer and a random-access memory device;
   wherein wavelengths that are not to be processed in the memory module are passed through to a second memory module without delay and without electrical conversion, thereby reducing request latency for requests not intended for the memory module;
   wherein the memory controller is coupled in series first to the memory module and then to the second memory module using the optical channel;
   wherein the memory module is configured to monitor for and respond to requests in the optical channel that are encoded in a specified set of wavelengths and the second memory module is configured to monitor for and respond to requests in the optical channel that are encoded in a second set of wavelengths.

14. The method of claim 13, wherein a buffered repeater mechanism in the memory module facilitates extending the distance between the memory controller and the second memory module beyond a distance normally associated with an optical channel.

15. The method of claim 13, wherein receiving the request and sending a response involve using pass-through and merging logic included in the memory buffer that allows the optical channels to be shared between multiple memory modules with optical interconnect that are coupled in series.

16. A computer system that includes a memory system, comprising:
- a processor that includes a memory controller;
- a first memory module and a second memory module, where each memory module comprises a memory buffer and a random-access memory device; and
- an optical channel that supports wavelength-division multiplexing;
- wherein the memory controller is coupled in series first to the first memory module and then to the second memory module using the optical channel;
- wherein the memory buffer in a memory module is configured to receive a request from the memory controller via the optical channel, handle the request by accessing the random-access memory device, and send a response to the memory controller;
- wherein the first memory module is configured to monitor for and respond to requests in the optical channel that are encoded in a first wavelength and the second memory module is configured to monitor for and respond to requests in the optical channel that are encoded in a second wavelength; and
- wherein the first memory module removes the first wavelength from the optical channel while passing the second wavelength through without delay and without electrical conversion, thereby reducing request latency for requests not intended for the first memory module.

17. The computer system of claim 16, wherein a buffered repeater mechanism in the first memory module facilitates extending the distance between the memory controller and the second memory module beyond a distance normally associated with an optical channel.

18. The computer system of claim 16, wherein the memory buffers include pass-through and merging logic that allow the optical channels to be shared between multiple memory modules that are coupled in series.

19. The computer system of claim 18, further comprising:
- a second optical channel that carries responses from the first memory module to the second memory module and then to the memory controller;
- wherein the optical channel carries requests from the memory controller to the first memory module and then to the second memory module;
- wherein using wavelength-division multiplexing increases the capacity of the optical channels without increasing the number of optical fibers needed;
- wherein multiple memory modules with optical interconnect are configured to share the optical channels using wavelength-division multiplexing; and
- wherein the multiple memory modules are configured to allow the number of memory modules sharing the optical channel to be changed based on system memory need.

20. The computer system of claim 19, wherein the optical channel and the second optical channel are separate high-speed, uni-directional optical channels.

21. The computer system of claim 20,
- wherein the optical channel comprises one or more optical fibers;
- wherein the second optical channel comprises one or more optical fibers;
- wherein the traffic bandwidth need for the optical channel is predicted to be different from the traffic bandwidth needed for the second optical channel; and
- wherein the bandwidth of the optical channel and the bandwidth of the second optical channel are asymmetric to ensure that the optical channel with more traffic does not become a bottleneck.

* * * * *